United States Patent

Takahashi et al.

[15] 3,660,178

[45] May 2, 1972

[54] METHOD OF DIFFUSING AN IMPURITY INTO A COMPOUND SEMICONDUCTOR SUBSTRATE

[72] Inventors: Susumu Takahashi, Kokubunji; Hisao Nakashima, Hachioji; Masatoshi Migitaka, Kodaira, all of Japan

[73] Assignee: Hitachi, Ltd., Tokyo, Japan

[22] Filed: Aug. 14, 1970

[21] Appl. No.: 63,846

[30] Foreign Application Priority Data

Aug. 18, 1969 Japan....................................44/65205

[52] U.S. Cl. ........................148/189, 148/187, 252/62.3 GA

[51] Int. Cl. ...........................................................H01l 7/44

[58] Field of Search...................148/187, 189; 252/62.3 GA, 252/62.3 ZT

[56] References Cited

UNITED STATES PATENTS

| | | | |
|---|---|---|---|
| 3,001,896 | 9/1961 | Marinace | 148/189 X |
| 3,139,362 | 6/1964 | D'Asaro | 148/189 X |
| 3,239,393 | 3/1966 | Dill | 148/189 |
| 3,313,663 | 4/1967 | Yeh et al. | 148/189 X |
| 3,314,833 | 4/1967 | Arndte et al. | 148/189 |
| 3,502,518 | 3/1970 | Antell | 148/189 X |
| 3,544,468 | 12/1970 | Catano | 252/62.3 |

*Primary Examiner*—Tobias E. Levow
*Assistant Examiner*—J. Cooper
*Attorney*—Craig, Antonelli & Hill

[57] ABSTRACT

A semiconductor substrate of Group III–V compound such as GaAs or GaP covered uniformly with powder of the same kind of semiconductor with grain diameters of 20–500$\mu$ is placed in a quartz tube and a small piece of zinc is also placed in the tube at a place separated from the substrate, the zinc is heated above 700°C to evaporate it by a heating coil placed around the zinc, the substrate is also heated by a coil around it independently of the zinc, and a zinc gas is flowed by being carried by an argon gas over the heated substrate to diffuse zinc into the substrate from the vapor phase through the cover.

8 Claims, 3 Drawing Figures

INVENTORS
SUSUMU TAKAHASHI
HISAO NAKASHIMA
MASATOSHI MIGITAKA
BY Craig, Antonelli, Stewart & Hill
ATTORNEYS

METHOD OF DIFFUSING AN IMPURITY INTO A COMPOUND SEMICONDUCTOR SUBSTRATE

BACKGROUND OF THE INVENTION

1. Field of the Invention

This invention relates to an improvement in a method of diffusing an impurity into a compound semiconductor substrate.

2. Description of the Prior Art

It is known in the art that when an impurity such as zinc or cadmium is thermally diffused into a semiconductor substrate of Group III–V compounds such as GaAs GaAsP, GaAlAs or GaP which includes an element of high vapor pressure, i.e., As or P, the As or P is apt to be evaporated to thereby form a lattice defect in the substrate.

Such defect deteriorates the electrical characteristics of semiconductor elements made of the semiconductor substrate.

When an impurity is to be diffused into a compound semiconductor substrate including as its component an element having a high vapor pressure as described above, usually a substrate and an impurity to be diffused are hermetically sealed in a highly evacuated quartz ampoule and the ampoule is inserted into a furnace for heating to carry out the diffusion because of the necessity to suppress the vaporization of the element of high vapor pressure.

However, such method of using a closed tube is unsuitable for mass production and it is also difficult to precisely control the degree of diffusion of the impurity into the substrate. Further, since the surface of the substrate is exposed, an undesirable impurity such as copper is introduced into the substrate from the quartz ampoule and also the impurity to be diffused is deposited on the surface of the substrate at the time of cooling, which makes the surface of the substrate uneven. These have been the causes to deteriorate the electrical characteristics of the resulting elements.

SUMMARY OF THE INVENTION

An object of the present invention is to provide an improved impurity diffusion method which prevents the evaporation of an element having a high vapor pressure from a substrate and the introduction of an undesirable impurity into the substrate.

Another object of the present invention is to provide a further improved impurity diffusion method which is suited to mass production and can control the degree of diffusion of an impurity to be diffused.

According to the present invention, a compound semiconductor substrate is covered nearly uniformly with micro powder of the same kind of compound semiconductor material with a grain diameter of 20 — 500 $\mu$, the substrate thus covered is heated and an impurity to be diffused is passed thereonto or thereover in the gaseous state for a predetermined reaction time period, thus the impurity being caused to diffuse from the vapor phase.

DESCRIPTION OF THE PREFERRED EMBODIMENTS

The method of the present invention will be described in comparison with the conventional method for the sake of understanding.

A GaAs substrate will be described hereinbelow only as an example of compound semiconductors.

Figure 1:
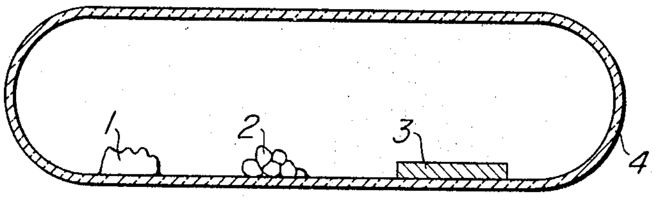
FIG. 1 PRIOR ART
FIG. 1 is a schematic view illustrating a conventional closed tube method.

Referring to FIG. 1, there is shown a schematic view wherein Zn is diffused from the vapor phase into a GaAs substrate by the conventional closed tube method.

The inner surface of a quartz ampoule 4 is preliminarily cleaned by first washing the surface thereof with hydrogen fluoride and then placing it in a hydrogen gas at a high temperature for a long time.

A GaAs crystal substrate 3, a Zn diffusion source 1 and small fragments of polycrystalline GaAs 2, each of which is suitably processed beforehand, are arranged at intervals in the ampoule 4 as shown in FIG. 1, and then the ampoule 4 is sealed after it is evacuated to, for example, about $5 \times 10^{-6}$ Torr.

In the conventional method, the sealed ampoule 4 is introduced into a furnace for diffusion (not shown) and heated to a temperature of 700°C. In consequence, Zn is evaporated from the impurity source 1 and the quartz ampoule 4 is filled with the Zn vapor. Then, the degree of diffusion of Zn into the GaAs substrate 3 is controlled by adjusting the heating temperature and time period.

In the above, the fragments of polycrystalline GaAs 2 are introduced in the ampoule so as to keep the vapor pressure of Zn at a constant value in the ampoule 4 at the heating temperature, and if they are not introduced in the ampoule, As is vaporized from the substrate 3 at the time when the sealed ampoule is heated and vacancies of As are produced in the substrate.

According to this method, since the surface of the substrate 4 is exposed in the ampoule 1, Zn and GaAs are deposited on the surface of the substrate because of rapid cooling of the substrate at the time of taking the ampoule 1 out of the heating part of the diffusion furnace. Further, even though the ampoule is cleaned up, an undesirable impurity such as Cu may more or less remain in the ampoule and it may be mixed in the surface portion of the substrate. As a result, a semiconductor device provided by the use of the GaAs substrate is deteriorated in its backward characteristic and noise is apt to be produced.

Figure 2:
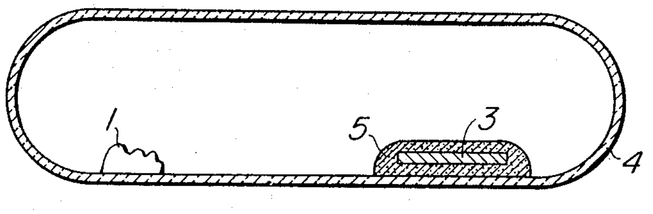
FIGS. 2 and 3 are schematic views of preferred embodiments according to the method of the present invention.

FIG. 2 is a schematic view for illustrating an embodiment of the present invention, in which parts identical to those in FIG. 1 have identical designations.

When this embodiment is compared with the example of conventional one shown in FIG. 1, it can be seen that this embodiment is featured in that a GaAs crystal substrate 3 is covered with micro powder of the same kind GaAs of polycrystal. This substrate and a piece 1 of Zn, which is a source of impurity to be diffused into the substrate, are arranged in an ampoule 4 at a spaced position and the ampoule is sealed after it is evacuated to a pressure of the same order as before.

Small fragments of a grain diameter of 20 – 500 $\mu$ is suited for the powder of the present invention.

It is desirable to select the thickness of the covering in a range of from 0.5 to 5 mm.

The ampoule 4 prepared as before is heated to a temperature of 600° – 800°C in a diffusion furnace (not shown). The degree of evaporation of Zn and the diffusion of Zn into the substrate 3 is controlled by adjusting the temperature and heating period of time.

As an example, an n-type GaAs single crystalline substrate 3 with resistivity 0.01 Ω-cm, area 3 mm² and thickness 300 $\mu$, the outer surface of which is covered with polycrystalline GaAs powder 5 with a grain diameter of 100 $\mu$ in a thickness of 1 mm, and a piece 1 of Zn of 5 g in weight are arranged in a cylindrical ampoule 4 with a diameter of 3 cm and 20 cm in length, at places spaced 15 cm from each other and the ampoule is sealed after it is evacuated to a pressure of not more than $1 \times 10^{-5}$ Torr.

The ampoule is then introduced in a diffusion furnace and after it is kept at a diffusion temperature of 700°C for 2 hours, a Zn diffused layer is formed to a depth of 8 $\mu$ from the surface.

According to this embodiment, it is prevented that an undesirable impurity such as Cu is mixed into the surface of the substrate and that As is deposited on the surface since the surface of the GaAs substrate is not exposed.

Then, in manufacturing semiconductor elements of this kind, the yield reaches about 80 percent, a considerable improvement compared with the conventional value of about 10 percent.

In the above embodiment, the powder serves not only to afford the above effect but also to keep the vapor pressure of As at a constant value.

The breakdown voltage of the semiconductor substrate having the impurity diffused layer provided according to this embodiment shows a very sharp characteristic compared with that of the conventional one and has a value more than two times that of the conventional one.

Figure 3:
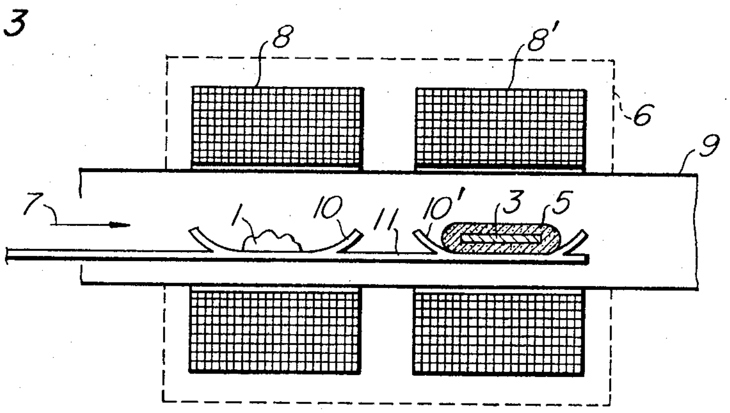

Now, another embodiment of the present invention which employs the open tube method will be described with reference to FIG. 3.

A quartz tube 9 is provided in such a manner as passing through a furnace 6 having heating coils 8 and 8'. Quartz boats 10 and 10' are carried on a quartz arm 11 at a distance of 30 cm from each other, and the arm is suitably held by a support (not shown).

An impurity 1 (for example Zn) to be diffused is put in the boat 10 and a single crystalline GaAs substrate 3 covered with polycrystalline GaAs powder 5 is disposed in the other boat 10'. The impurity 1 is heated by the heating coil 10 to a temperature of from 700° to 1100°C, for example 800°C, to be evaporated. The substrate 3 is heated by the heating coil 10' to a temperature of from 600° to 800°C, for example 700°C. Then an inert gas 7 such as hydrogen or argon is passed through the tube 9 in the direction indicated by the arrow as a carrier gas at a rate of 0.5 l/min and the vapor of the impurity 1 is passed over the substrate 3, thus the impurity diffuses into the substrate 3 from the vapor phase.

In the above, the diffusion conditions of the impurity can be precisely controlled in a wide range by separately controlling the heating temperatures by the heating coils 8 and 8' and by adjusting the flow rate of the gas.

Usually, the open tube method is used as a means for diffusion control since the diffusion is carried out in an atmosphere of carrier gas and the control of the gas flow rate is easy. However, it has the defect that because of a turbulence produced in the gas flow the electrical characteristics of the substrate obtained by this method are liable to be irregular. But when the open tube method is used by covering a substrate with the same kind of material as that of the substrate as described before, the above-mentioned defect is moderated. Thus, a novel effect is found in this embodiment.

As described above, this embodiment is suited for mass production and its utility is very high.

We claim:

1. A method of diffusing an impurity into a substrate of Group III–V compound semiconductor, comprising the steps of substantially uniformly covering the outer surface of a Group III–V compound semiconductor substrate with a micro-powder of said semiconductor compound, heating the thus covered substrate, and passing a gas of an impurity to be diffused into the substrate by means of a carrier gas over the substrate so as to diffuse the impurity into the substrate through the covering from the vapor phase.

2. A method of diffusing an impurity into a Group III–V compound semiconductor substrate, comprising the steps of covering a Group III–V compound semiconductor substrate wherein the Group V element comprises at least one of arsenic and phosphorus with a powder of said semiconductor compound having a grain diameter of 20 – 500 μ to a substantially uniform thickness, heating the substrate thus covered to a temperature of from 600° – 800°C, and allowing an impurity that is to be diffused into the substrate to react with the heated substrate through the covering whereby the impurity is diffused into the substrate from the vapor phase.

3. A method of diffusing an impurity into a semiconductor substrate according to claim 2, wherein the Group III–V compound semiconductor is one selected from the group consisting of GaAs, GaAsP, GaAlAs and GaP.

4. A method of diffusing an impurity into a semiconductor substrate according to claim 3, wherein the impurity is one of Zn and Cd.

5. A method of diffusing an impurity into a Group III–V compound semiconductor substrate, comprising the steps of substantially uniformly covering a Group III–V compound semiconductor substrate wherein the Group V element comprises at least one of As and P with a powder of said semiconductor compound having a grain diameter of 20 – 500 μ to a thickness of 0.5 – 5 mm, putting the substrate thus covered in a quartz ampoule, putting a small piece of impurity material to be diffused into the substrate in the quartz ampoule at a position spaced from the substrate, evacuating and hermetically sealing the ampoule, and heating the ampoule to a temperature of 600° – 800°C to vaporize the impurity and to react the vaporized impurity with the substrate through the covering to thereby diffuse the impurity into the substrate.

6. A method of diffusing an impurity into a substrate according to claim 5, wherein the semiconductor is one selected from the group consisting of GaAs, GaAsP, GaAlAs and GaP and the impurity is one selected from the group consisting of Zn and Cd.

7. A method of diffusing an impurity into a Group III–V compound semiconductor substrate, comprising the steps of substantially uniformly covering a Group III–V compound semiconductor substrate wherein the group V element comprises at least one of As and P with a powder of said semiconductor compound having a grain diameter of 20 500 μ to a thickness of 0.5 – 5 mm, placing the substrate thus covered in a quartz tube, placing a small piece of impurity material to be diffused into the substrate in the quartz tube at a position spaced from the substrate, heating the portion where the impurity is placed to a temperature of 700° – 1100°C to evaporate the impurity, heating the portion where the substrate is placed to a temperature of 600° – 800°C, feeding a carrier gas into the quartz tube from one end thereof to pass the vaporized impurity over the heated substrate portion to thereby diffuse the impurity into the substrate from the vapor phase through the covering by a vapor phase reaction.

8. A method of diffusing an impurity into a substrate according to claim 7, wherein the semiconductor is one selected from the group consisting of GaAs, GaAsP, GaAlAs and GaP and the impurity is one selected from the group consisting of Zn and Cd.

* * * * *